United States Patent [19]

Widlar

[11] 4,441,116

[45] Apr. 3, 1984

[54] CONTROLLING SECONDARY BREAKDOWN IN BIPOLAR POWER TRANSISTORS

[75] Inventor: Robert J. Widlar, Jalesco, Mexico

[73] Assignee: National Semiconductor Corporation, Santa Clara, Calif.

[21] Appl. No.: 282,490

[22] Filed: Jul. 13, 1981

[51] Int. Cl.³ .................... H01L 27/02; H01L 29/72
[52] U.S. Cl. ........................ 357/43; 357/36; 357/51; 357/34; 357/41; 357/46
[58] Field of Search ................. 357/36, 43, 51, 34, 357/41, 46

[56] References Cited

U.S. PATENT DOCUMENTS

| 3,740,621 | 6/1973 | Carley | 357/36 |
| 3,911,472 | 10/1975 | Craft | 357/51 |
| 3,936,863 | 2/1976 | Olmstead | 357/51 |
| 4,143,392 | 3/1979 | Mylroie | 357/43 |

OTHER PUBLICATIONS

Porter, J. A., *IEEE Transactions on Elect. Devices*, Sep. 1976, vol. ED23, pp. 1098-1099, "JFET-Transistor Yields Device with Negative Resistance".

*Primary Examiner*—Martin H. Edlow
*Assistant Examiner*—Jerome Jackson
*Attorney, Agent, or Firm*—Gail W. Woodward; Paul J. Winters; Michael J. Pollock

[57] ABSTRACT

A power transistor design that eliminates thermally initiated secondary breakdown in fast, double-diffused transistors is described. The power dissipation capability is made independent of collector voltage, avoiding safe area restrictions below 0.9 $BV_{CBO}$.

2 Claims, 4 Drawing Figures

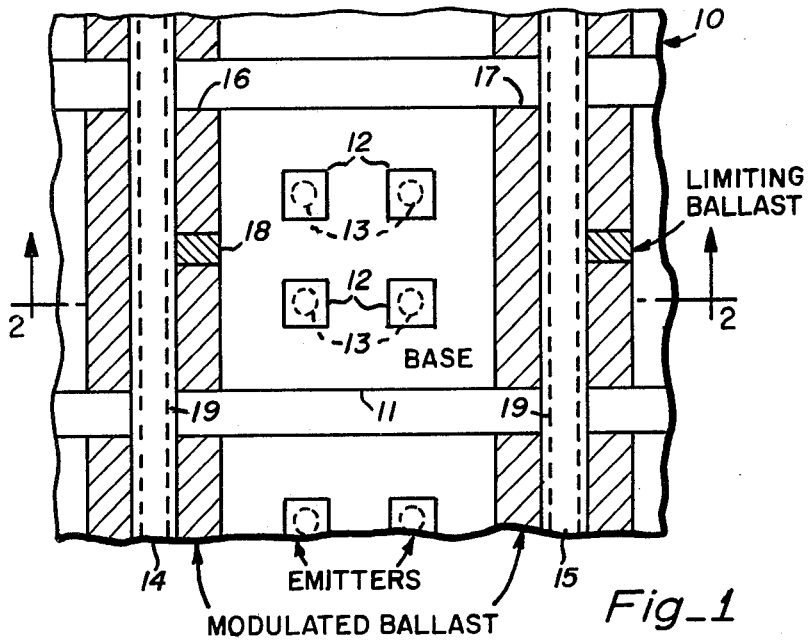
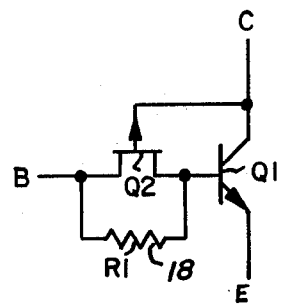
Fig_3
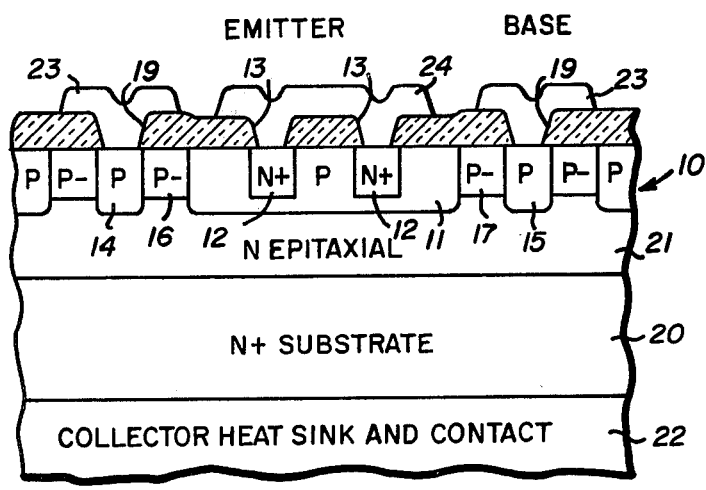
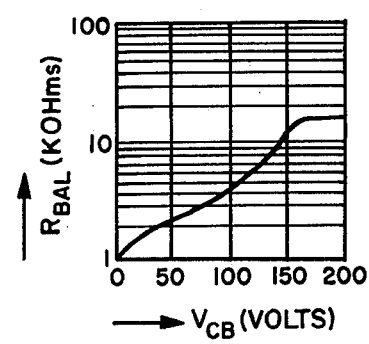
Fig_4

CONTROLLING SECONDARY BREAKDOWN IN BIPOLAR POWER TRANSISTORS

BACKGROUND OF THE INVENTION

The invention relates to power transistor structures in which a large number of individual elements are coupled in parallel to act as a single unit.

In linear applications, maximum transistor stress occurs at higher voltages when considerable power is being dissipated for longer than 1 ms. Because the emitter base voltage of bipolar transistors has a negative temperature coefficient, the tendency is for maximum conduction where temperature is highest. The resulting hot spot formation can become unstable, leading to secondary breakdown. This can be avoided by ensuring uniform conduction.

The problem of localization can be better understood by considering two parallel connected transistors. The following equations account for the transconductance and thermal effects.

$$V_{BE} = V_{BE0} + \frac{kT}{q} \ln \frac{I_C}{I_{C0}} + \phi_B \theta_j V_{CE} I_C \quad (1)$$

$$\frac{dV_{BE}}{dI_C} = \frac{kT}{qI_C} + \phi_B \theta_j V_{CE} > 0 \quad (2)$$

$$\theta_j = \frac{\Delta T}{V_{CE} I_C}, \quad g_m = \frac{qI_C}{kT} \quad (3)$$

$$\Delta T < \frac{kT}{q\phi_B} \quad (4)$$

Where:
$g_m$ = base to collector transconductance
$q$ = electron charge
$k$ = Boltzmann's constant
$T$ = Absolute temperature
$\theta_j$ = Thermal resistance of the transistor
$\phi_B$ = Temperature coefficient of the transistor base to emitter voltage.
$I_C$ = Collector Current
$V_{CE}$ = Collector to emitter voltage
$V_{BE}$ = Base to emitter voltage.

Current sharing becomes potentially unstable when $V_{BE}$ decreases with increasing $I_C$. Without ballasting, this can occur for a temperature rise greater then 10° C. These equations are only valid when the $g_m$ of the parallel connected transistors is equal. Once an instability is initiated, the mathematical description is less concise. The process exhibits hysteresis, and the destabilization will persist until $\Delta T$ is reduced to some lower value.

The situation can be improved with resistive ballasting in which a resistor is inserted in series with each emitter element. (A base ballast resistor can be moved to the emitter for analysis by dividing its resistance by transistor current gain.) The following related equations show that sufficient conditions for stability are simple and straightforward.

$$V_B = V_{BE0} + R_{bal} I_C + \phi_B \theta_j V_{CE} I_C \quad (5)$$

$$\frac{dV_B}{dI_C} = R_{bal} + \phi_B \theta_j V_{CE} > 0 \quad (6)$$

$$V_{bal} = R_{bal} I_C, \quad \theta_j = \frac{\Delta T}{V_{CE} I_C} \quad (7)$$

$$\Delta T < \frac{V_{bal}}{\phi_B} \quad (8)$$

Where:
$R_{bal}$ is the ballast resistance
$V_{bal}$ is the voltage across the ballast resistor
$V_B$ is the combined $V_{bal}$ and $V_{BE}$.

A fraction of volt drop across the ballast resistor will insure uniform conduction for $\Delta T = 300°$ C., even if low level injection is assumed ($\phi_B = 2.5$ mV/°C.) and mutual thermal coupling between elements is ignored. This shows the forward biased secondary breakdown can be completely eliminated for any reasonable set of operating conditions, suffering only an insignificant increase in transistor losses.

Standard bipolar power transistors rely upon high level effects rather than ballast to reduce $g_m$ and $\phi_B$. The high level threshold can be lowered by using wide emitters and thick, lightly doped bases; but the improvement available is rather limited. Such structures are inherently slow. Single-diffused transistors also have the collector-base junction located close to the heat sink, which reduces thermal resistance and improves thermal coupling among elements.

SUMMARY OF THE INVENTION

It is an object of the invention to create a power transistor in which secondary breakdown is avoided by base resistor ballasting of the individual parallel connected elements that make up the structure.

It is a further object of the invention to incorporate a junction field effect transistor into the base of an element in a plural element power transistor whereby the collector voltage modulates the series base resistance which acts as a ballast.

These and other objects are realized using a cell structure that involves plural parallel-connected individual transistors. Each transistor is represented by a separate emitter diffused into a common base region. Opposing edges of the base region are coupled to a spaced apart base connection by means of an ion-implanted resistance layer, the backside of which forms a PN junction with the transistor collector. This means that the collector potential will deplete the resistor which will then be voltage variable as a function of collector voltage. The resistor thickness and doping density are established so that the resistor pinches off completely above the maximum collector voltage rating for the transistor. If desired, the resistor can be made to pinch off at a voltage below the maximum collector voltage and to include a short section of more highly doped material which acts as a shunt resistor. With this construction the resistor acts as if there were a shunt fixed section so that at pinch off the resistance goes up to some fixed value not infinity.

When a large number of such cells are parallel connected, the resulting device is base resistance ballasted with variable resistors that adjust themselves as a function of collector voltage. The resulting power transistor does not display the secondary breakdown characteristic. Such a device can be operated within its power rating at any desired collector voltage below $BV_{CEO}$ without concern for instabilities.

BRIEF DESCRIPTION OF THE DRAWING

FIG. 1 shows the cell layout of the invention.

FIG. 2 is a cross-section of the cell of FIG. 1 taken at line 2—2.

FIG. 3 is a schematic diagram of the cell of FIG. 1.

FIG. 4 is a graph plotting the resistance of the FET of FIG. 3 as a function of collector voltage.

DESCRIPTION OF THE INVENTION

FIG. 1 shows the topography of one form of power transistor cell constructed in accordance with the invention. FIG. 2 is a cross-section of the FIG. 1 structure taken at line 2—2. It is to be understood that the drawing is not to scale. In particular FIG. 2 is exaggerated dimensionally in order to better illustrate the invention. Also while the drawing shows four individual emitters, more or fewer could be used.

The transistor is constructed on an N+ type wafer 20, a fragment or chip of which is shown at 10. The substrate is of low resistivity to reduce series resistance and has an epitaxial surface layer 21 of a resistivity suitable for a transistor collector. In FIG. 1 the contact metallization has been omitted for clarity.

As shown in FIG. 2, the chip 10 is coupled to a heat sink surface 22 which also serves as a collector connection. This arrangement is typical of a double diffused bipolar silicon transistor. For example, heat sink 22 may be the typical T0-3 power transistor package. One complete power transistor cell is shown in FIG. 1 along with a portion of each of the adjacent cells. The central square 11 represents a transistor base diffusion of P-type conductivity normally created by a boron diffusion that typically extends about three microns into the semiconductor N-type epitaxial layer 21.

Four heavily doped emitters 12 are shown diffused into base 11. These emitters are small so that they individually have high frequency capability and a large periphery to area ratio. The dashed lines 13 inside the emitters represent the areas where the planar oxide will be removed and contact made to the silicon. It can be seen that a metallization finger 24 (not shown in FIG. 1) extended vertically on the drawing could be used to parallel connect all of the emitters in a plurality of cells in a row.

A pair of contact busses 14 and 15 are formed with P-type diffusions to extend across the device. They are spaced apart from base 11 and extend parallel with the edges thereof as shown. Two resistive strips 16 and 17 span the region between base 11 and busses 14 and 15 respectively. These resistive regions are preferably created using ion implantation to control their impurity content, but they are typically diffused after implantation so that they extend below the semiconductor surface to about the same extent as the base region 11. It can be seen that the undersides of resistors 16 and 17 will face the transistor N-type collector. Therefore the collector bias voltage will act to deplete or pinch off the resistors. This means that resistors 16 and 17 are voltage variable as a function of collector voltage and are coupled in series with base 11. Diffused busses 14 and 15 will be contacted by metallization 23 (not shown in FIG. 1) that will contact the silicon through contact 19 which is shown in dashed outline in FIG. 1.

Since resistors 16 and 17 are voltage variable and may pinch off completely within the normal transistor collector voltage, a more heavily doped section 18 is included within resistor 16. This section would ordinarily be created by an additional ion implant that will dope it sufficiently to raise its pinch off voltage above that of the transistor rating.

Section 18 can be regarded as a resistor that shunts the voltage variable resistor as shown in FIG. 3. This drawing is a schematic representation of the cell of FIG. 1. As can be seen, a bipolar junction transistor $Q_1$ has its base driven through a junction field effect transistor $Q_2$ which has resistor 18 in parallel between its source and drain. $Q_2$ has its gate connected to the collector of $Q_1$ because these devices are commonly fabricated into the silicon. As a practical matter resistor 18 could be portrayed as a second field effect transistor connected in parallel with $Q_2$. However, if the pinch off of this second device is never exceeded, it will always be on and will act like a shunt resistor.

FIG. 4 is a graph that plots resistance as a function of voltage for a typical cell as shown in FIG. 1. It will be noted that at the lower voltage the resistance is about 1K ohms and rises with voltage to about 15K ohms which is the value of resistor 18.

EXAMPLE

Power transistors were constructed using the cell structure of FIG. 1. Typical die size was a 185 mil square with 316 such cells connected in parallel for a total of 1264 emitters. The resulting devices can dissipate 250 watts at voltages above 200 V. At 10 amperes the collector saturation was typically less than 1 volt. The $f_T$ was over 50 MHz. Two different structures were prepared and optimized for different voltages by selecting the thickness and resistivity of layer 21. In the 200 volt version the typical current gain at ten amperes was about 25. In the 60 volt version the current gain was about 75 at ten amperes.

Neither structure displayed any secondary breakdown instabilities within their respective voltage ratings up to 250 watts.

The invention has been described and operating examples detailed. When a person skilled in the art reads the foregoing, there are alternatives and equivalents that will become apparent that are within the spirit and intent of the invention. Accordingly, it is intended that the scope of the invention be limited only by the following claims.

I claim:

1. A power transistor cell comprising:
   a semiconductor substrate of one conductivity type having an upper surface and a resistivity suitable for a transistor collector function;
   a base region of opposite conductivity type extending from said surface into said substrate, said base region having a closed periphery defined at said surface;
   at least one emitter region of said one conductivity type located within said base region periphery and extending part way through said base region;
   a base contact region of said opposite conductivity type extending from said surface into said substrate spaced apart from and parallel to said base region over at least a portion of said periphery;
   a first resistor region of said opposite conductivity type spanning the space between said base region and said base contact region and extending into said surface of said substrate so as to form a pn junction with said substrate whereby said first resistor is variable in response to the voltage on the collector of said cell, the resistivity of said first resistor region being selected to produce a pinch off voltage below that of the collector to base voltage breakdown of said cell;

a second resistor region confined to within a relatively small portion of said first resistor region, said second resistor region being more heavily doped than said first resistor region so as to have a pinch off voltage above that of said collector to base voltage breakdown of said cell; and means for making electrical contact with said emitter region, said base contact region and said substrate.

2. The transistor cell of claim 1 in combination with a plurality of parallel connected cells to form a single power transistor.

* * * * *